United States Patent [19]
Monahan et al.

[11] Patent Number: 6,044,124
[45] Date of Patent: Mar. 28, 2000

[54] DELTA SIGMA PLL WITH LOW JITTER

[75] Inventors: Peter Monahan, Dublin; Declan Farrelly, Portmarnock; Nial O' hEarcain, Dun Laoghaire; John G. Ryan, Rochestown; Mark Symth, Lisselan Tramore, all of Ireland

[73] Assignee: Silicon Systems Design Ltd., Dublin, Ireland

[21] Appl. No.: 08/916,619

[22] Filed: Aug. 22, 1997

[51] Int. Cl.$^7$ .................................. H03D 3/24; H03L 7/00
[52] U.S. Cl. ................................. 375/376; 331/1 A
[58] Field of Search .................................. 375/376, 373, 375/375; 329/325, 324, 313; 331/10, 1 A, 18, 34; 332/127, 126; 327/156

[56] References Cited

U.S. PATENT DOCUMENTS

| | | | |
|---|---|---|---|
| 5,021,754 | 6/1991 | Shepherd et al. | 332/128 |
| 5,038,117 | 8/1991 | Miller | 331/16 |
| 5,038,120 | 8/1991 | Wheatley et al. | 332/128 |
| 5,256,980 | 10/1993 | Itri | 328/104 |
| 5,517,678 | 5/1996 | Klank et al. | 455/182.2 |
| 5,818,303 | 10/1998 | Oishi et al. | 331/1 A |

OTHER PUBLICATIONS

"Fractional–N Synthesisers", *Electronics World*, Mar. 1996, pp. 196–199.
"Fractional–N Synthesis", *Electronics World*, Feb., 1996, pp. 130–135.
Riley, Tom A.D., et al "Delta–Sigma Modulation in Fractional–N Frequency Synthesis", *I.E.E.E. Journal of Solid–State Circuits*, vol. 28, No. 5, May 1993.
Best, Roland E., *Phase–Locked Loops, Theory, Design and Applications.*, Chapter 3, pp. 136–153.

*Primary Examiner*—Chi H. Pham
*Assistant Examiner*—Khai Tran
*Attorney, Agent, or Firm*—Richard K. Robinson, Attorney at Law

[57] ABSTRACT

A phase lock loop circuit for a digital radio generates the sampling frequency for sampling an incoming signal by storing the samples of the incoming signal in an accumulator at a first frequency. The accumulator is unloaded at the sampling frequency. A microprocessor monitors the rate in which the samples are stored in the accumulator and provides a switching signal to vary the sampling frequency in small increments to prevent the accumulator from overflowing or underflowing.

21 Claims, 12 Drawing Sheets

TABLE 1

| OFL_A$_{old}$ | OFL_B | OFL_B$_{old}$ | m |
|---|---|---|---|
| 0 | 0 | 0 | 0 |
| 0 | 0 | 1 | -1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 2 |
| 1 | 1 | 1 | 1 |

DELTA SIGMA PLL WITH LOW JITTER

BACKGROUND OF THE INVENTION

This invention relates to phase lock loop circuits and particular to phase lock loop circuits used in digital communications.

Digital radios used in the next generation of satellite radio receivers have been specified to sample the demodulated digital data at a sampling frequency of 48 kHz (Kilohertz) plus or minus 100 ppm (parts per million). Each digital radio has no way of knowing what is the exact sampling frequency of the source (i.e. transmitter). In the situation where the receiver sampling frequency is operating at 48 kHz and the transmitter sampling frequency is 48 kHz plus 100 ppm, the receiver, over time, will overflow. A microprocessor connected to a sample buffer in the receiver can detect this overflow condition by the accumulation of samples in the buffer. If the transmitter sampling frequency is 48 kHz minus 100 ppm and the receiver sampling frequency is 48 kHz then an underflow condition will occur. Likewise, a microprocessor connected to a sample buffer in the receiver can detect this underflow condition by the depletion of samples in the buffer. The overflow and underflow conditions are avoided by making changes to the receiver's sampling frequency. However, only course adjustments to the sampling clock can be made resulting in audible distortion in the signal.

An oscillator in the receiver matched to the transmitter oscillator would not offer a practical solution to the above identified problem for a number of reasons. Firstly, all transmitters and receivers would require matched oscillators, an impractical requirement. Secondly, the signal's transmission path could introduce short term variations in the rate, in the receiver this would manifest itself in the same way as a mismatch in the transmitter and receiver rates.

A Phase Lock Loop (PLL) circuit is typically used in the receiver to generate the sample frequency. The PLL includes a voltage controlled oscillator (VCO) that provides the sampling frequency (or an integer multiple of) as an output. The voltage that controls the VCO is provided by comparing a stable reference frequency, Fref, with a feedback signal, Ffb. The action of the PLL causes the voltage to change so that Ffb equals Fref. In direct frequency synthesis Ffb is derived by dividing the VCO output frequency, Fvco, by N. Following the comparison of Fref and Ffb, the control voltage can cause Fvco to increase or decrease based upon the results of the comparison. However, this type of feedback arrangement holds the Fvco frequency to N times the reference frequency and thereby restricting the resolution in the sampling clock. It is possible to have a very large N, so given the necessary resolution in Fvco, however, this places very severe demands on the PLL circuitry.

Indirect frequency synthesis was discussed in the 1993 IEEE paper 0018-9200/93$03.00 in an article entitled Delta-Sigma Modulation in Fractional-N Frequency synthesis by Tom A. D. Riley, Miles Capeland and Tad A. Kwasniewski, and in a two part article in Electronics World (February and March 1996) entitled Fractional-N Synthesis by Cosmo Little. In these articles the authors described delta sigma modulation and fractional-N frequency division techniques to perform indirect digital frequency synthesis based upon the use of a PLL. However, the techniques described had a number of short comings. In the first paper, there are restrictions on the operational range of the PLL. In the second paper, the PLL's jitter performance is less than satisfactory for certain frequency values. Both of these short comings are over come in this invention.

SUMMARY OF THE INVENTION

A satellite digital radio receiver includes an antenna for receiving a radio signal transmitted from a satellite. The received radio signal is converted to an intermediate frequency by a down converter. The down converted signal is demodulated by a demodulator and is decoded by an audio decoder algorithm such as an MPEG decoder. The decoded sample data is loaded into the receive buffer at a rate which averages to that of the transmitter sample rate. The sample data is unloaded from the buffer by the locally generated sample rate. The combination of the buffer and the PLL creates a re-synchronization circuit which is used by a microprocessor to unload the samples from the buffer to a Digital to Analog (D/A) converter. The analog signal from the D/A converter can then be used to drive a traditional audio speaker. The microprocessor can detect if the sampling frequency is different from the transmitter sampling frequency by monitoring the average number of samples in the buffer. Based upon the average number of samples the microprocessor can generates a signal that causes the PLL to adjust its output frequency in small decrements/increments to prevent an underflow/overflow while maintaining a low jitter specification. It is the ability of the PLL to generate a very low jitter clock which can be changed by small increment/decrement that form the basis of this patent.

In the embodiment, the method of correcting the rate is to multiply a stable reference frequency by N+M where N and M are integers. The precise value of M is continuously changing such that it averages to some value m. In the described embodiment the values of M are limited to −1, 0, 1 and 2, and the value of m is restricted to 0 to 1. For instance, in the embodiment, if M has the values 0, 1, 2, 1, −1, 1, then its average value, m, would be ⅔. In the long term, the input frequency is multiplied by N+m. This, in effect, allows the generation of some frequency that is a non-integer multiple of the reference frequency. The means by which the M sequence is generated is very important. By generating M in a particular manner the PLL circuitry can effective average out M to give m, resulting in a low jitter stable clock. If the M sequence is ineffectively generated then the PLL will be ineffective in averaging M resulting in a high jitter clock. In this embodiment, the values of M are restricted to −1, 0, 1 and 2, and m is restricted to the range 0 to 1. In a more generic embodiment these restrictions would not apply.

DETAIL DESCRIPTION OF THE EMBODIMENTS

Figure 1:
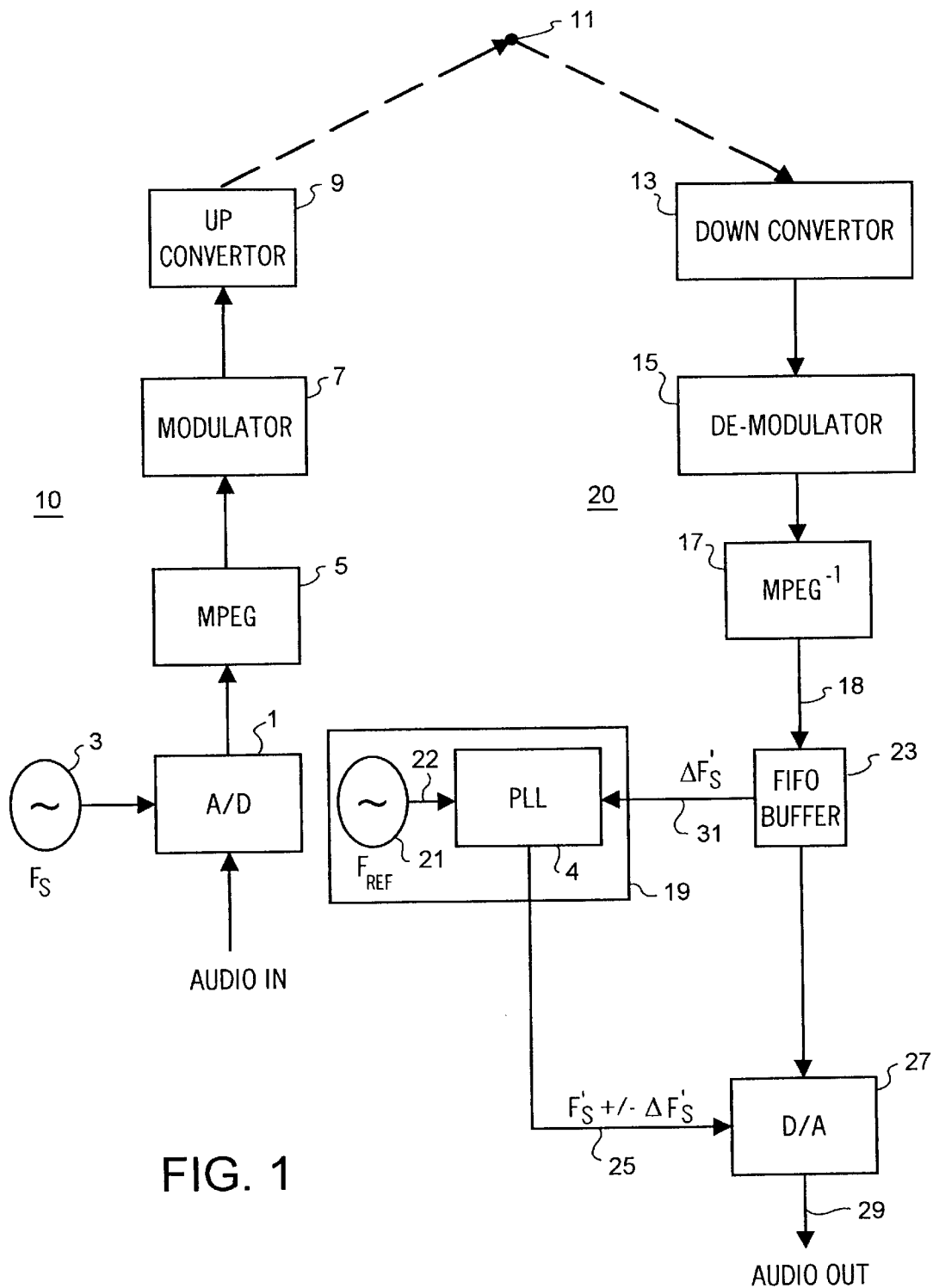
FIG. 1 is a block diagram of a digital satellite radio system according to the invention.

In FIG. 1, to which reference should now be made, there is shown a digital satellite radio system that includes a transmitter section 10 and a receiver section 20. The transmitter section 10 receives an audio input into a A/D converter 1 which is clocked by Fs from a frequency source 3. In the embodiment described in FIG. 1, the frequency of the frequency source 3 is 48 kilohertz with a +/−100 Parts Per Million (PPM) accuracy. The output of the A/D converter 1 is applied to an MPEG converter 5 which transforms the input from the A/D converter 1 from the time domain into the frequency domain according to the MPEG specification. The output of the MPEG converter 5 is applied to a modulator 7 as is currently present in most radio transmitters and an up converter 9 which up converts the output of the MPEG modulator to radio frequencies, for transmission to a satellite 11.

The output of a signal beamed from the satellite 11 is received by a receiver 20 that includes a down converter 13, a demodulator 15 and an MPEG converter 17 which converts the demodulated signal provided by the demodulator 15 into a digital signal. The digital signal is applied to a FIFO Buffer 23 by conductor 18 and then to a D/A converter 27. The sampling frequency for the receiver 20 is provided by a local clock generator 19 which output a frequency Fs'. The Sigma Delta Phase Lock Loop (PLL) 19 includes a stable reference frequency source 21 and a Phase Lock Loop circuit 4. The frequency Fs' as with Fs is equal to 48 kilohertz plus or minus 100 parts per million. However, as long as Fs and Fs' meet the specification of 48 kHz plus or minus 100 parts per million, then the radio transmitter and receiver are operating within specification. Even so there can be distortion of the audio output in trying to correct the mismatch between Fs and Fs' by either dropping samples, in case of overflow, or by adding samples, in case of underflow, or in the coarse adjustment of Fs'. The difference in frequency between Fs and Fs' is a result of the plus or minus 100 ppm accuracy specification.

The Sigma-Delta Phase Lock Loop (PLL) 19 solves this problem by allowing for the fine grain adjustments in Fs'. Fine grain adjustments in Fs' (changes in the region of 10's ppms) will not introduce audio distortion in the final audio signal. The Sigma-Delta Phase Lock Loop will adjust the output frequency that is provided on conductor 25 to the digital to analog converter D/A 27 to approach the same frequency as Fs. The D/A converts the output of FIFO buffer 23 into an audio output that is provided on conductor 29. The Sigma-Delta Phase Lock Loop adjusts its frequency in response to indications from the FIFO buffer 23 that over an extended period of time it is accumulating data in such a manner as to indicate that the frequency source 21 has a faster frequency than the frequency source 3, or that the frequency source 21 has a slower frequency than frequency source 3.

Figure 2:
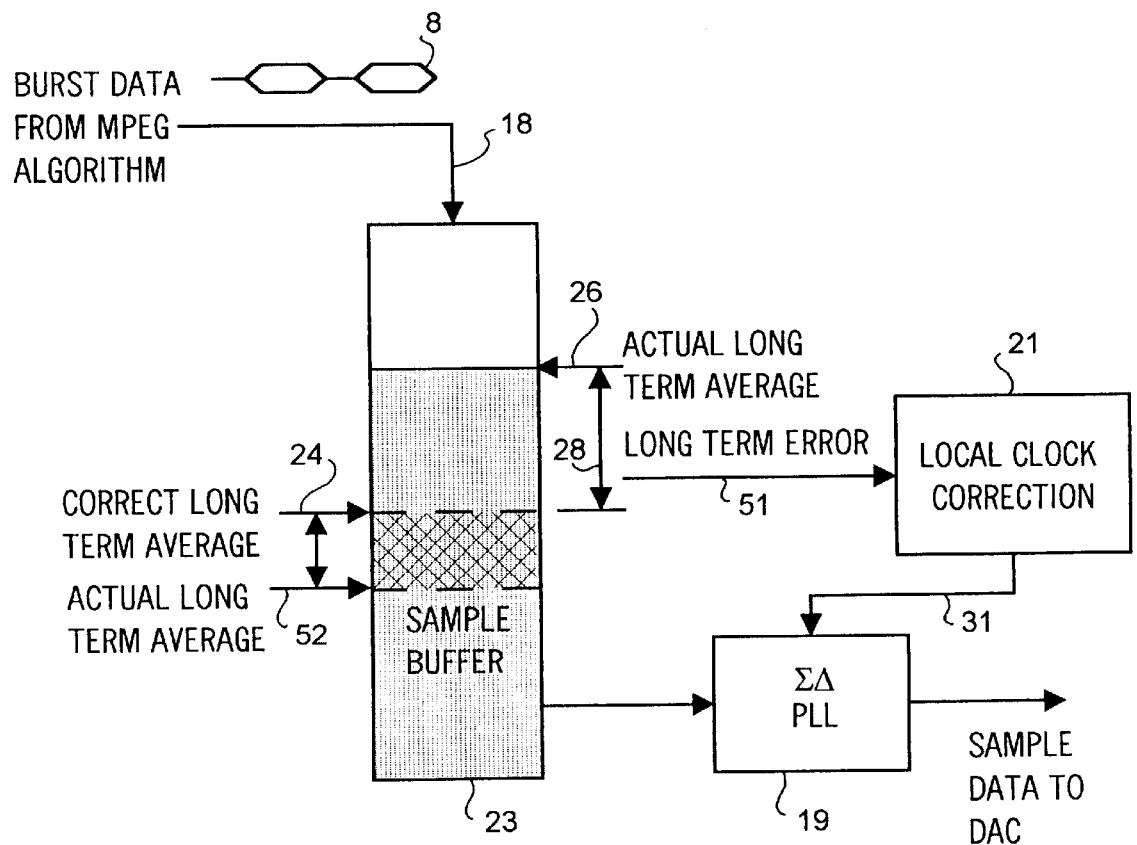
FIG. 2 is a functional block diagram describing the sensing of overflow conditionings in the FIFO buffer 23 of FIG. 1.

Referring to FIG. 2, which is a functional diagram of the operations of the FIFO buffer 23, data is provided from the MPEG decoder 17 in burst of data 8 and applied to the FIFO buffer 23. The average rate at which data is loaded into the FIFO is the sampling rate of the source, Fs 3. Under ideal conditions the FIFO buffer will maintain a correct constant long term average number of samples as is indicated by the arrow 24 in FIG. 2. However, if Fs' is slower than Fs, then the long term average will rise to the position indicated by arrow 26 with the delta or difference in the long term average being indicated by arrow 28. Any long term error is provided by line 51 to the local clock correction 21 function (a microprocessor). The local clock correction provides an output 31 to the Sigma-Delta Phase Lock Loop 19 which causes it to change its frequency Fs' so as to reduced the error in the FIFO. The Sigma-Delta Phase Lock Loop 19 is able to change Fs' in sufficiently small steps, while maintaining low jitter, so as to avoid introducing audio distortion in the reconstructed audio signal. Fs' clocks the sample data out of the FIFO to the digital to analog converter 27.

If can be seen from FIG. 2 that just observing the average number of samples in the FIFO buffer 23 that clock discrepancies can be detected and corrected. In FIG. 1 or 2 (assuming FIG. 1), corrections can be made to the Sigma-Delta Phase Lock Loop 19 in order to finely adjust the frequency of the clock applied to the D/A converter 27. Although not shown, the embodiments of FIGS. 2, 3, 5 and 7 are typically implemented by a microprocessor.

Figure 3:
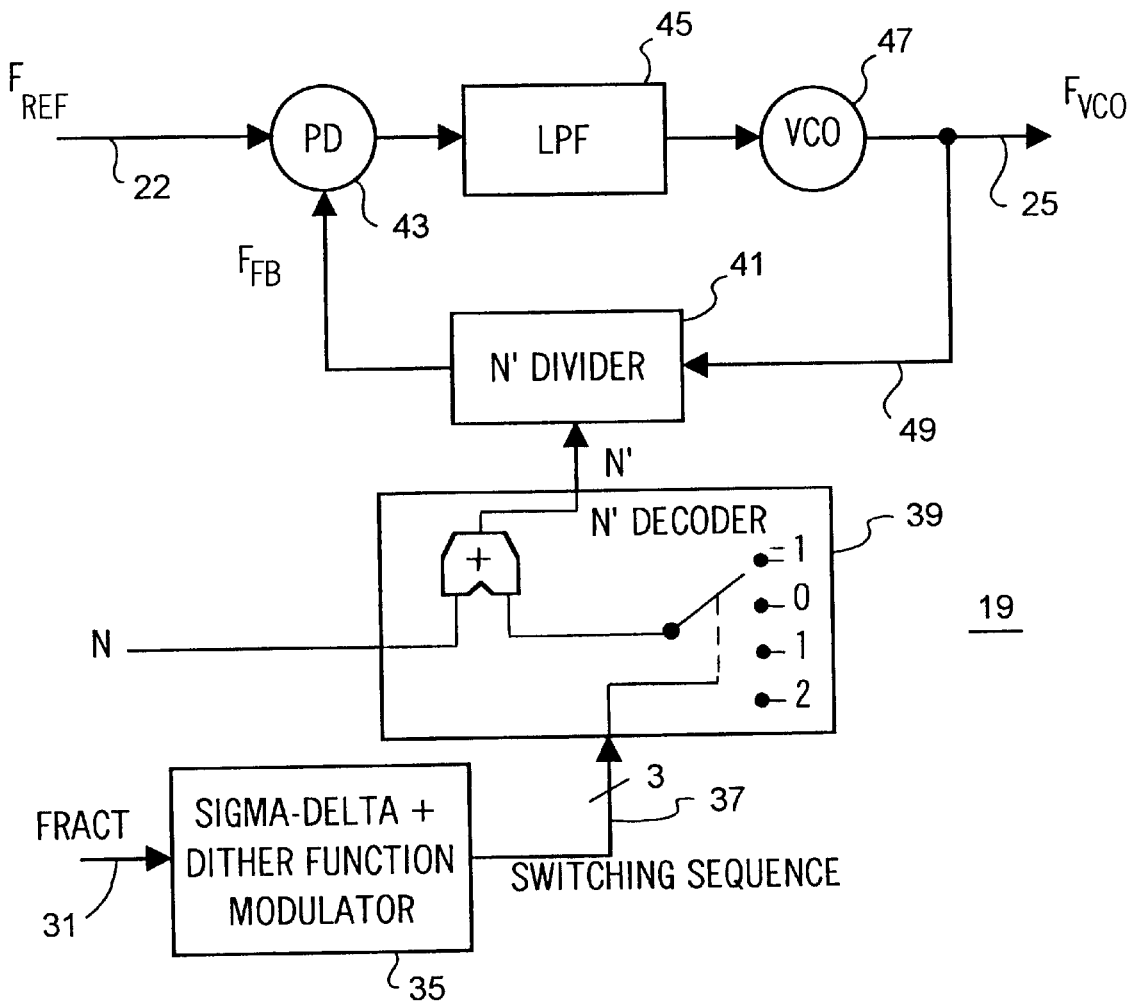
FIG. 3 is a block diagram of the local clock 19 of the digital satellite radio of FIG. 1.

FIG. 3 is a block diagram of the Sigma-Delta Phase Lock Loop 19. In the embodiment shown the Sigma-Delta Phase Lock Loop 19 has three inputs, Fref, N and FRACT, and one output Fvco. N and FRACT are integers provided by the user to generate a particular output frequency. Fref is the input reference frequency to the system, Fvco is the Sigma-Delta Phase Lock Loop output frequency. The output frequency of the Sigma-Delta Phase Lock Loop is determined by equation Fvco=Fref.(N+FRACT/$2^P$), where P is typically fixed and a function of the particular implementation. The value of FRACT is limited to the rate $0.2^P-1$. The range of N is a function of the particular Sigma-Delta Phase Lock Loop implementation.

In FIG. 3 the PLL reference frequency, Fref, and the feedback frequency Ffb are applied to the Phase Detector (PD) 43. The PD 43 compares the phase of Fref with Ffb and based upon the comparison provides an output signal to the Low Pass Filter (LPF) 45. The output signal from the PD 43 is filtered by the LPF 45. The filtered signal is basically a slowly changing or varying DC signal and is applied to a Voltage Control Oscillator (VCO) 47. The Voltage Control Oscillator 47 generates a clock, Fvco, whose frequency is controlled by the output of the LPF 45. The Fvco is also applied from conductor 25 via conductor 49 to N' divider 41. For constant N' divider value the feedback action of the phase lock loop causes the output frequency of the VCO, Fvco, to be equal N' times the reference frequency, Fref. The N' divider 41 is a programmable divider which divides the output clock of the VCO, Fvco, by N' to generate the feedback signal Ffb. The actual value used by the programmable divider is generated by the N' decoder 39 and the Sigma-Delta plus Dither function modulator 35. In this implementation the Sigma-Delta plus Dither function modulator 35 generates a sequence of values, M, which can be −1, 0, 1 or 2. These values are provided to the N' decoder 39 via conductor 37. The N' decoder 39 adds the sequence for the Sigma-Delta plus Dither function modulator 35 to the supplied value of N to generate the next N' divider value. A new sequence value is provided, and therefore a new N' divide value, each time N' divider has completed its division. The manner in which the divider is switched is designed with two goals in mind. The first is to give the divider an average value, m. The second is to shape the noise spectrum generated by the switching so that it has only higher frequency components and thereby will be attenuated by the Phase Lock Loop resulting in low jitter on the VCO clock, Fvco. The switching function is generated by a Sigma-Delta modulator and a Dither function. A Sigma delta modulator on its own operates unsatisfactory for certain values of FRACT, for these values, tones appear in the shaped spectrum, thereby limiting system performance and operation. A Dither function was added to the Sigma-Delta Modulator to break up these tones so allowing for satisfactory system performance over the full range of FRACT.

Figure 10:
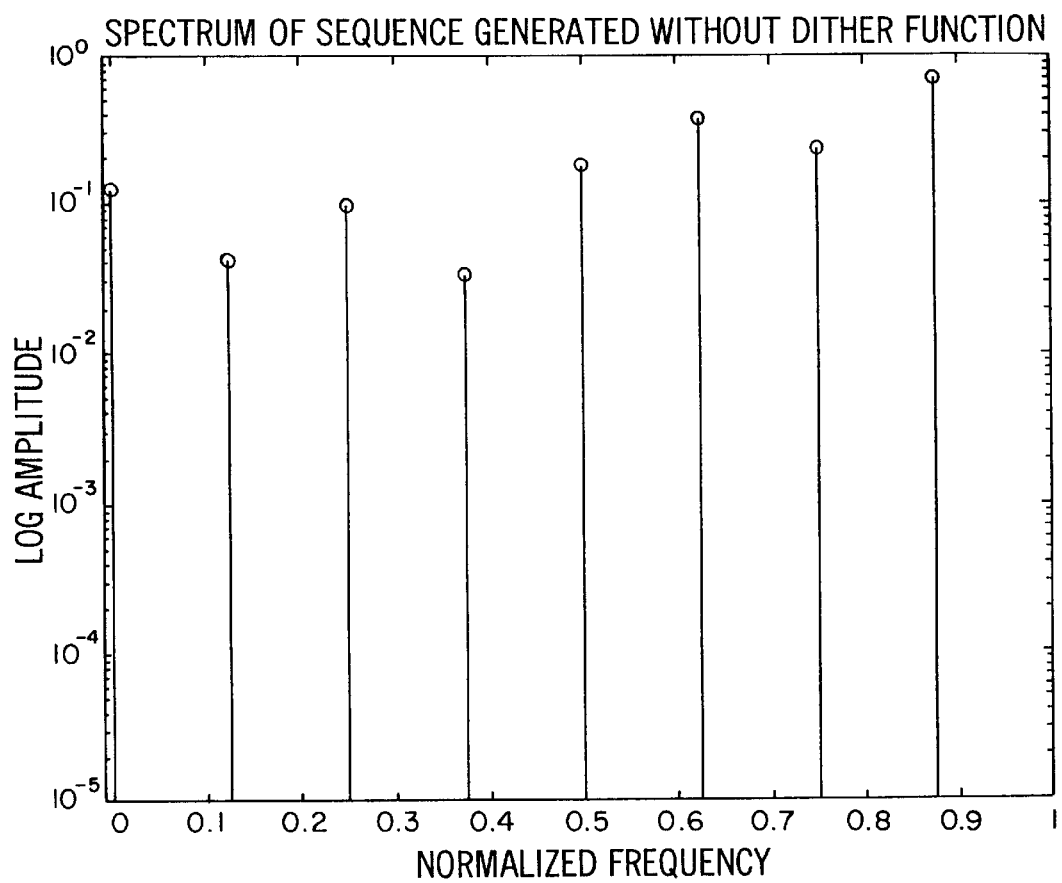
FIG. 10 is the spectrum of the programmable divider switching sequence generated without the dither function.
Figure 11:
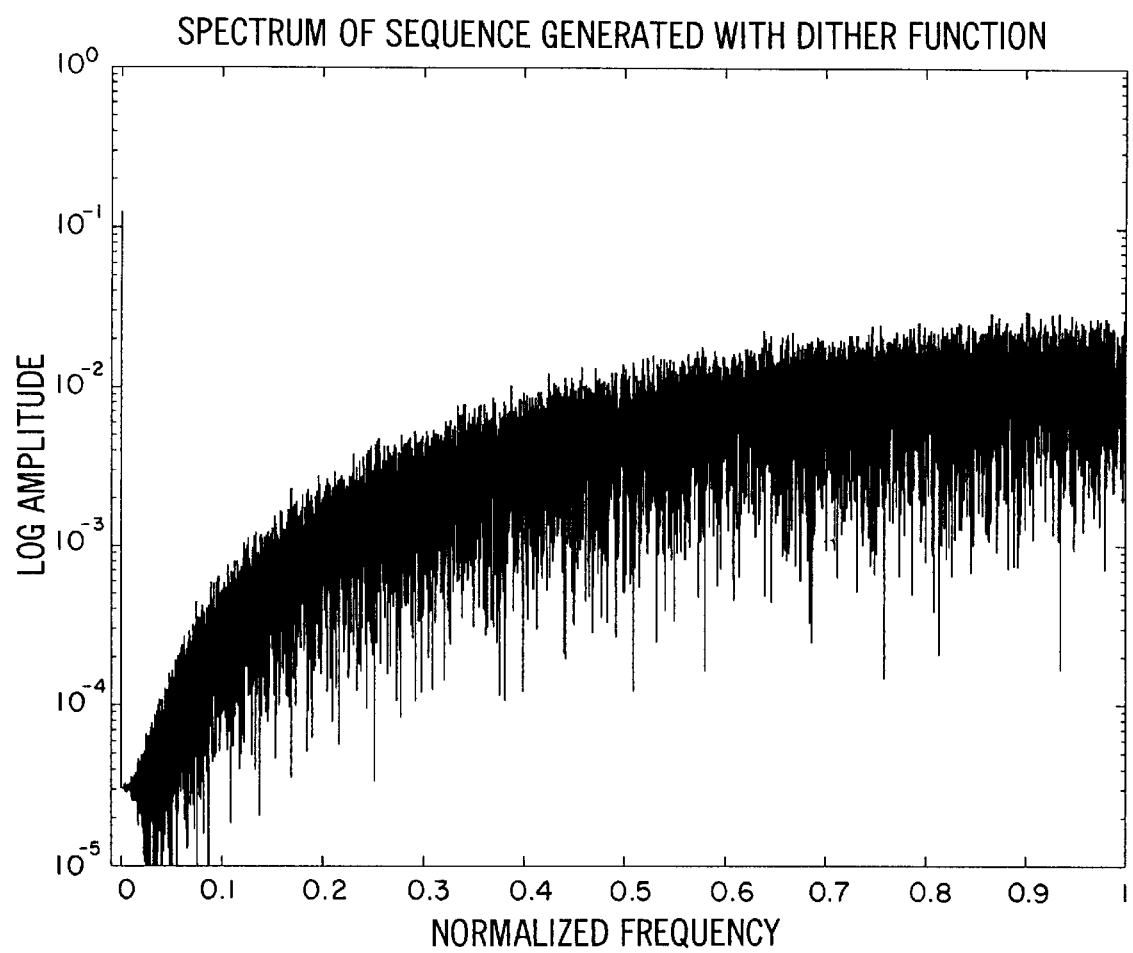
FIG. 11 is the spectrum of the programmable divider switching sequence generated with the dither function.

The advantage of using the Sigma-Delta Plus Dither function Modulator over a Sigma-Delta Modulator is illustrated in FIG. 10 and 11. FIG. 10, shows the spectrum of the switching sequence for a FRACT which is one eight full scale (i.e. want to generate a sequence which has an average of 0.125) when using only a Sigma-Delta Modulator. The DC or average value of the sequence is correct, however, the noise shaped spectrum now consists of a number of tones. FIG. 11 shows the spectrum of the switching sequence that is generated by the Sigma-Delta Plus Dither function Modulator. The tones are no longer present and the noise spectrum has a much better characteristic (i.e. weak at low frequencies and strong in the high frequencies).

In the described implementation of the system the sequence, M, generated by the Sigma-Delta plus Dither function modulator 35 can only have the values −1, 0, 1 or 2. The Sigma-Delta plus Dither function modulator 35 generates the sequence so that it will have an average value of FRACT/2(in the implementation the average value is limited to the range 0 to 1) and is noise shaped. For instance if the M sequence out of the Sigma-Delta plus Dither function modulator was a repetition of the following sequence 0, 1, 2, 1, −1, 1, then the average value of the sequence, m, would be $\frac{2}{3}$. The frequency generated by the Sigma-Delta Phase Lock Loop 19 would be Fref.(N+$\frac{2}{3}$), i.e. a non-integer multiple of the reference frequency. In the described implementation a second order Sigma-Delta modulator is used, in a generic system a different order could be used. In a generic system the range of M values could be expanded or reduced. Additionally the average of the sequence, m, need not be limited to 0 to 1.

Figure 4:
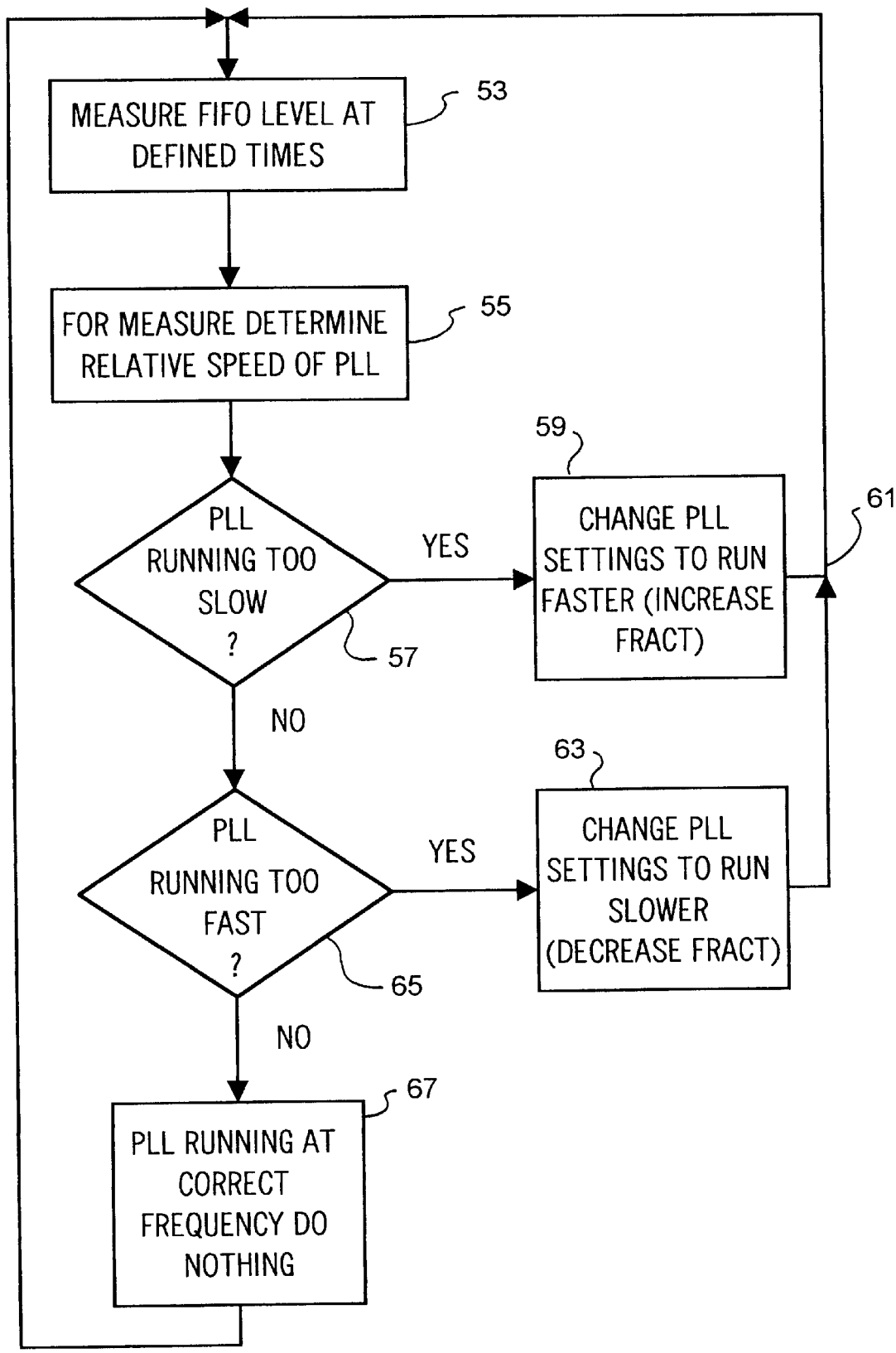
FIG. 4 is a flow diagram showing the generation of the error correction signal for the phase lock loop 19 of FIG. 1.

FIG. 4, is a flow block diagram illustrating the steps used to develop the correction signal FRACT that is control to the Sigma-Delta Plus Dither Function Modulator 35. At block 53, periodically, the contents of the FIFO buffer 23 is measured. Following each measurement, a determination is made of the speed of Fs' compare to Fs. If Fs' or the Phase Lock Loop is running slow, as is determined by decision block 57, its settings are changed to run faster at block 59 following which via node 61 the FIFO levels change. If decision block 57 determines that the Phase Lock Loop is running two slow, then a check is made at decision block 65 to see if the Phase lock loop 19 is running two fast. If the Phase lock loop is running too fast then the yes line is taken and the phase lock loop settings are changed to run slower at block 63 following which the FIFO level is once again monitored at block 53. If the Phase Lock Loop is not running too fast, then there is no changes made to the divider at block 67.

As an example, consider a Fvco which is 6.5 times Fref. This Fvco or Fs' is running slightly faster than Fs. To reduce Fs', the average value of the sequence generated by the Sigma-Delta plus Dither function modulator 35 is reduced. This is achieved by decreasing the value of FRACT. A reduction in FRACT will change the switching sequence −1, 0, 1 and 2 so it will have a slightly lower average value, say 0.4. This will result in a Fvco that is 6.4 times Fref.

Figure 5:
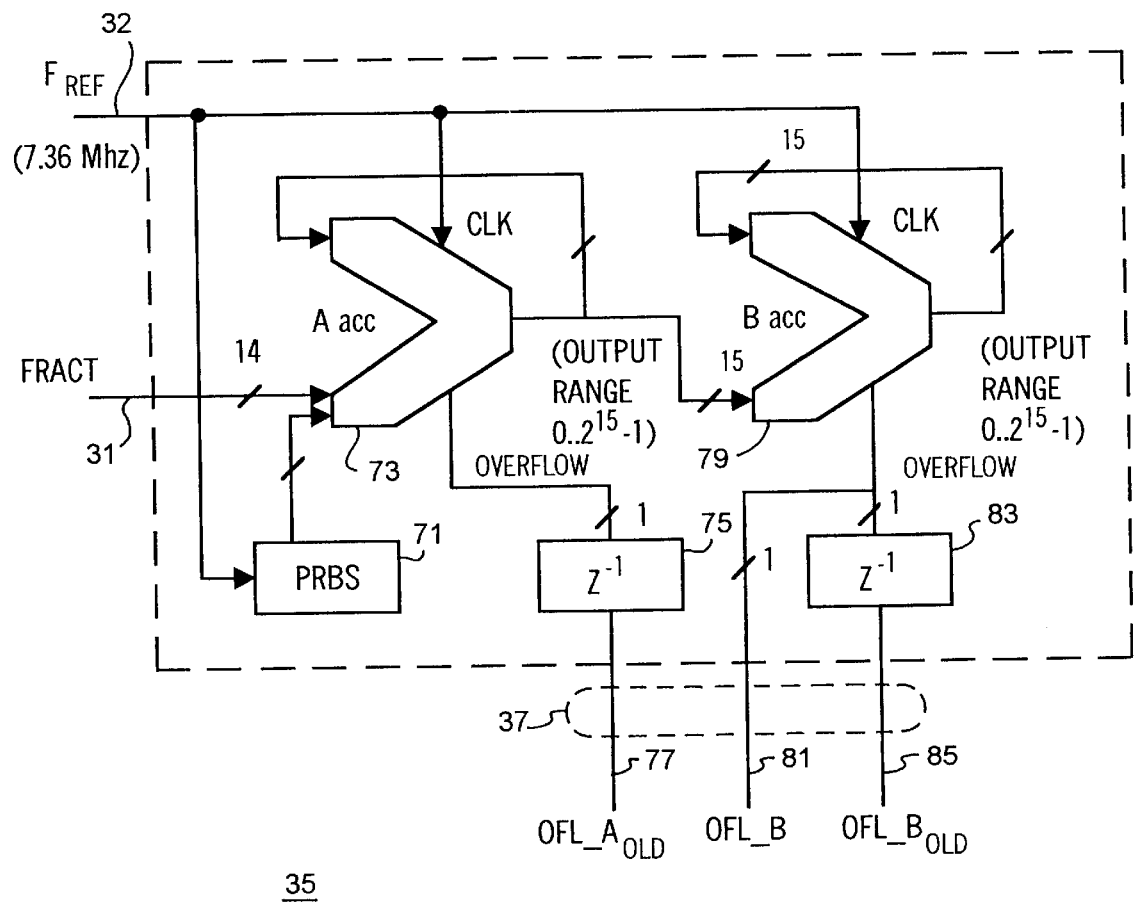
FIG. 5 is a functional block diagram of the sigma delta plus dither function modulator of FIG. 3.

The Sigma-Delta Plus Dither Function Modulator 35 is illustrated in FIG. 5 to which reference should now be made. There is an A accumulator 73 which is clocked by the frequency $F_{IN}$ which, in the case of the embodiment, is 7.36 megahertz signal that is applied to the modulator via conductor 32 and FRACT is applied via conductor 31 where the A accumulator, which is arithmetic logic unit, combines FRACT with its output. The A accumulator is a 15-bit accumulator and FRACT is a 14-bit signal. The input to the A accumulator also includes as a least significant bit the output of a Pseudo Random Bit Sequencer (PRBS) 71. This means that M is equal to 15. When the A accumulator indicates an overflow condition, this output is stored in a register 75 noted as Z-1 and is provided as an output on conductor 77 as OFL_$A_{OLD}$. The output of the A accumulator is then applied to a B accumulator 79 where it is combined with the B accumulator output. When the output overflow conditions occur from the B accumulator 79, it is indicated on conductor 81 as OFL_B and if there is a prior accumulated overflow condition, the prior overflow condition is stored in register 83 and indicated a OFL_$B_{OLD}$.

Figures 6, 7:
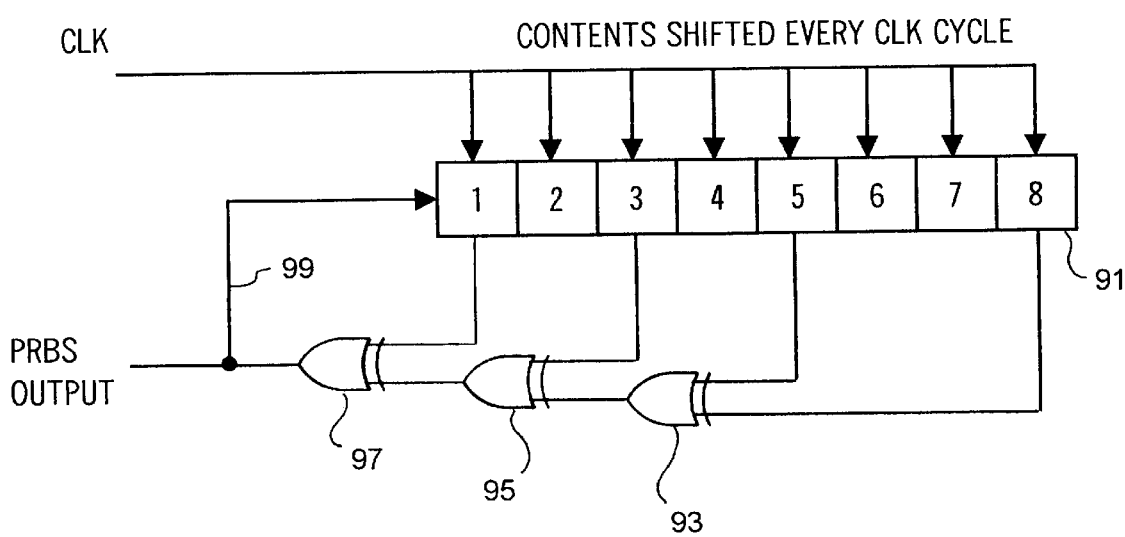
FIG. 6 is the truth table of delta sigma modulator of FIG. 5.
FIG. 7 is a schematic diagram of the PRBS 71 of FIG. 5.

In FIG. 6, Table 1 is the Truth Table which shows the decoding of the output of the sigma-delta dither function 35 by the N' decoder 39 for each value of the output of the sigma-delta plus dither function 35 to obtain the value of M. It has been found that decoding m according to FIG. 6 provides the appropriate bandwidth and the results of FIGS. 12 and 13.

FIG. 7 is a schematic diagram of the PRBS output and includes a shift register 91 which is clocked by the $F_{VCO}$ and its input includes the output of an exclusive OR 97 that is applied to its input via conductor 99. The input to the exclusive OR gate 97 is from the first position in the shift register 91 and the output of exclusive OR 95. The input to exclusive OR 95 is the third position in the shift register 91 and the output of exclusive OR 93. Exclusive OR 93 exclusively OR's the output of position 5 in the shift register 91 with position 8 of the shift register 91. It was found that by pseudo randomly varying the value of FRACT will prevent tones from being set up in the audio output of the digital satellite radio.

Figure 8:
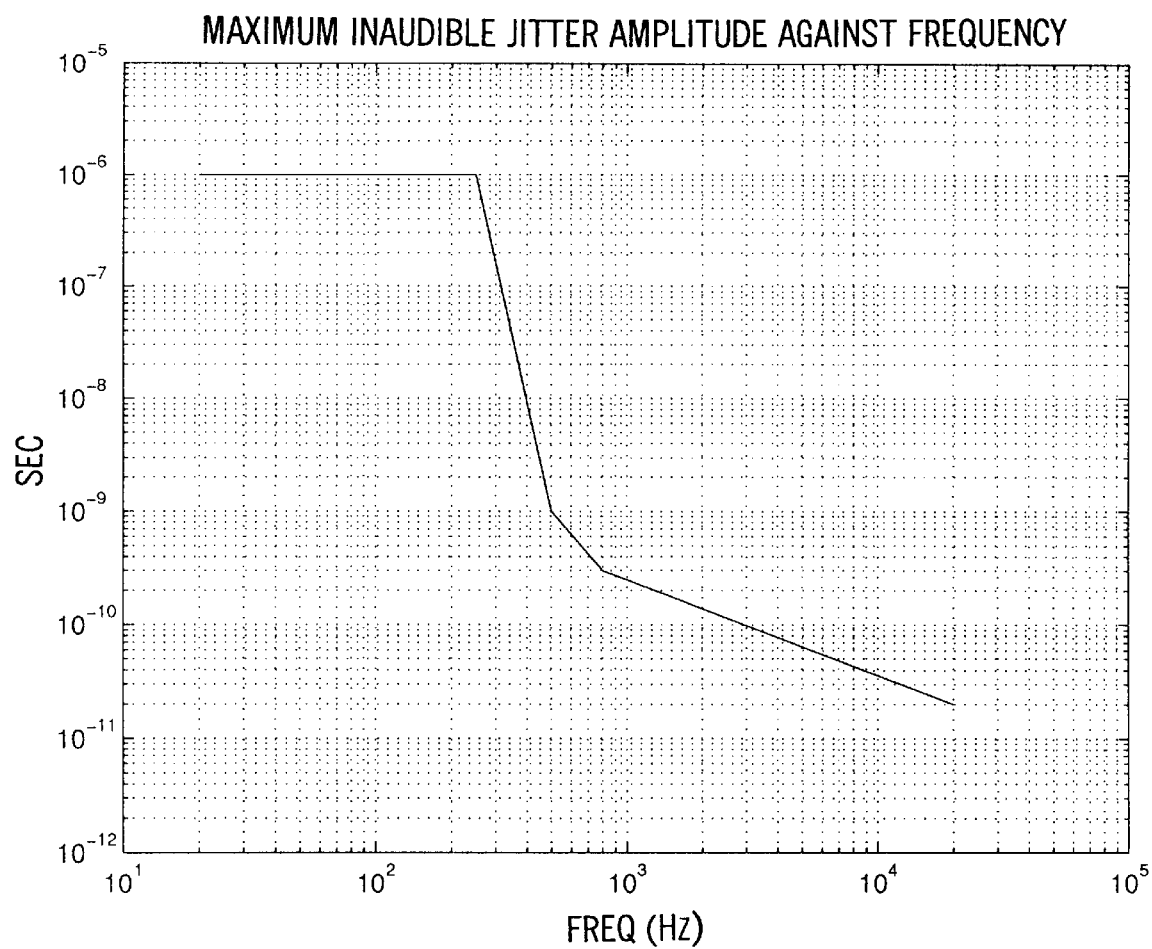
FIG. 8 is a plot of jitter amplitude versus jitter frequency according to the specification of the digital satellite radio of FIG. 1.

FIG. 8 is a spectrum diagram of the specification for jitter amplitude versus frequencies for digital satellite radios. It should be noted that the amplitude has to be less than $10^{-6}$ over most of the audio range and it can not be greater than 2 times $10^{-11}$ for the upper frequency edge of the audio range.

Figure 9:
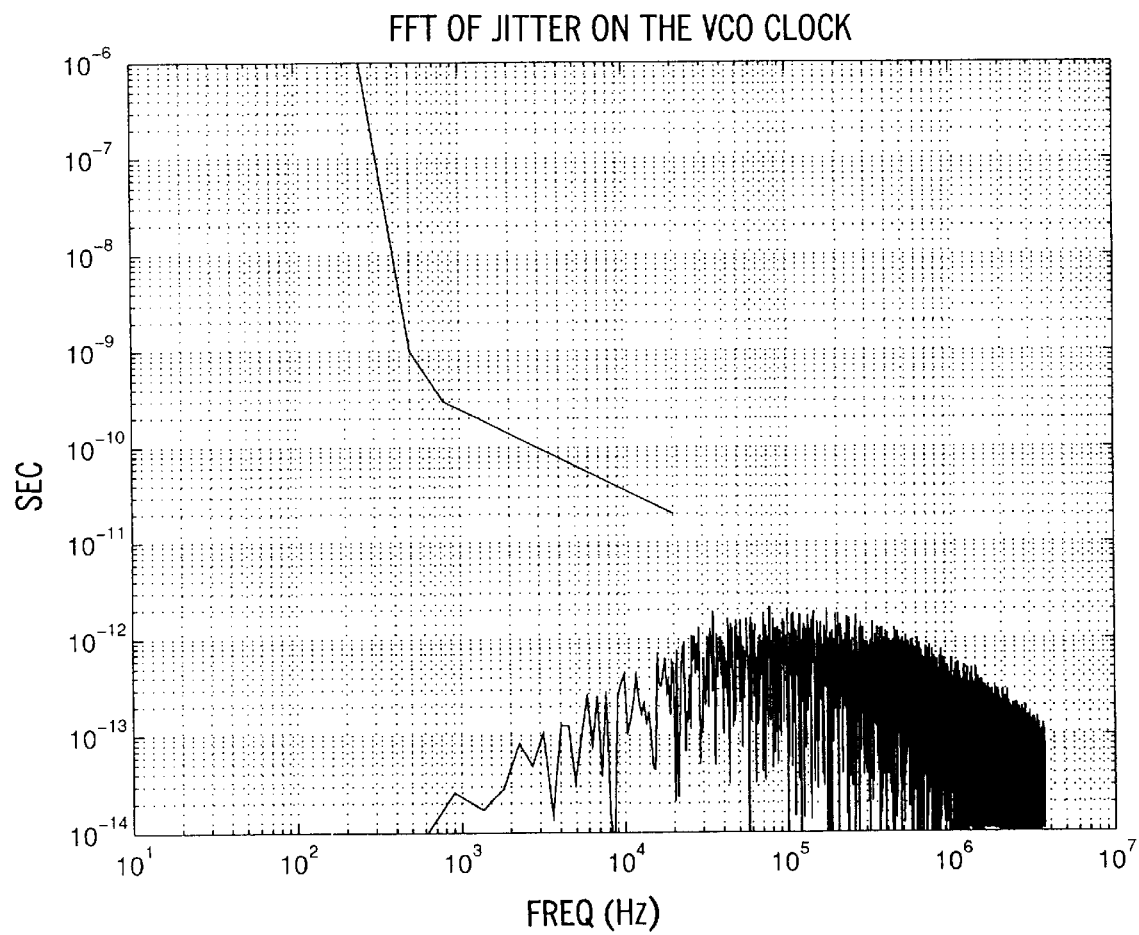
FIG. 9 is an amplitude versus frequency response of the jitter of the satellite radio of FIG. 1 according to the invention.

FIG. 9 is a spectrum diagram of a digital satellite radio using the PLL according to the invention and shows the significant results of the test of the digital satellite radio receiver 20 of FIG. 1 where if looking at the upper frequency end of the curves between $10^4$ and $10^7$, it is shown that most of the jitter noise occurs beyond the audio range and in any event is less than the minimum required by the specification of FIG. 8 (i.e. All the noise amplitude is below $10^{-11}$).

Figure 12:
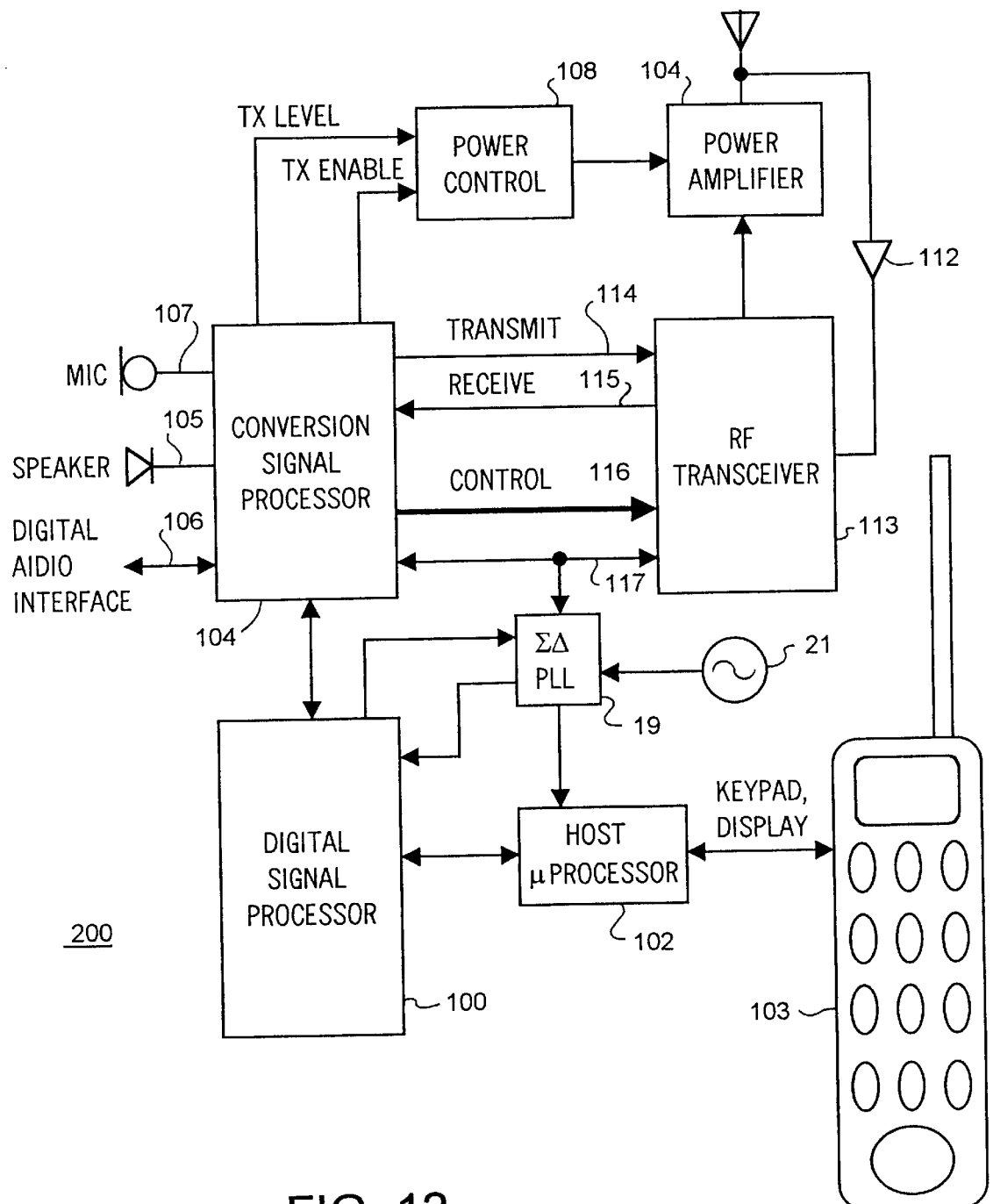
FIG. 12 is a block diagram of a cellular telephone incorporating a Sigma Delta Phase Lock Loop according to the invention.

FIG. 12 is a block diagram of an alternate embodiment of FIG. 1 in which a cellular telephone such as a digital satellite telephone or even a basic cellular telephone 200 has included therein a Sigma Delta Phase Lock Loop (PLL) 19 according to the invention. The cellular telephone includes a basic chip set that is available from corporations such as Lucent Technologies in which a conversion signal processor 104 converts and dispatches the analog and digital base band signals between the RF transceiver and digital signal processor. Although the prior art used frame and multiframe counters to stay synchronized, the digital signal processor 100, using the techniques described in conjunction with FIG. 2, will adjust the output of the Sigma Delta Phase Lock Loop (PLL) 19 to keep the timing events synchronized with better than quarter symbol resolution. On transmits, the signal is converted into a signal that can be passed via conductor 114 to the RF transceiver. The digital signal processor 100 handles the error correction and the data compression such as that described in conjunction with the MPEG converter and down converter that was discussed in conjunction with FIG. 1.

The RF transceiver 113 handles and performs transmit modulations receiving and frequency synthesizing. The receive path includes a single down converter, digital gain control and quadrature phone demodulation. The transmit path consists of an offset oscillator mixer and a direct up converter with a ninety degree (90°) phase spliter. A frequency agile UHF synthesizer selects the RF channel for both transmit and receive. The receive IF local oscillator, for quadrature phone demodulation and transmit IF local oscillator for the offset oscillator mixer are fixed frequency phase lock loops in the prior art. However, with the event of the Sigma Delta Phase Lock Loop, the receive IF local oscillator may be adjusted to compensate for any errors or frequency difference with the transmitter that generated the receive signal.

There is a power control 108 for controlling the power of the transmit signal to the power amplifier and on the receive line, a low noise amplifier 112 amplifies the received signal prior to application to the RF transmitter 113.

A host computer 102 handles the interface between the keypad and display 103 and the digital signal processor. The timing for the RF transceiver 113, the conversion signal processor 104, the digital signal processor 100 and the host microprocessor 102 are all controlled by the Sigma Delta Phase Lock Loop (PLL) 119 with a local oscillator 18 providing the input frequency to the Sigma Delta Phase Lock Loop (PLL) 19.

Figure 13:
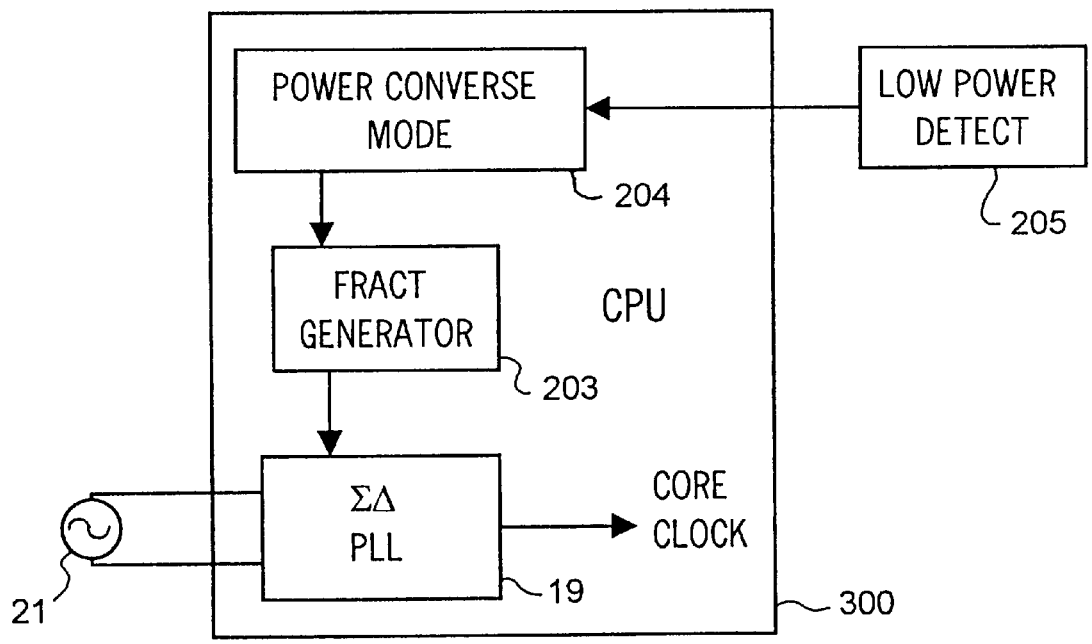
FIG. 13 is a block diagram of a CPU having a core timing generator according to the invention; and, FIG. 14 is an alternate application of the Sigma Delta Phase Lock Loop.
Figure 14:
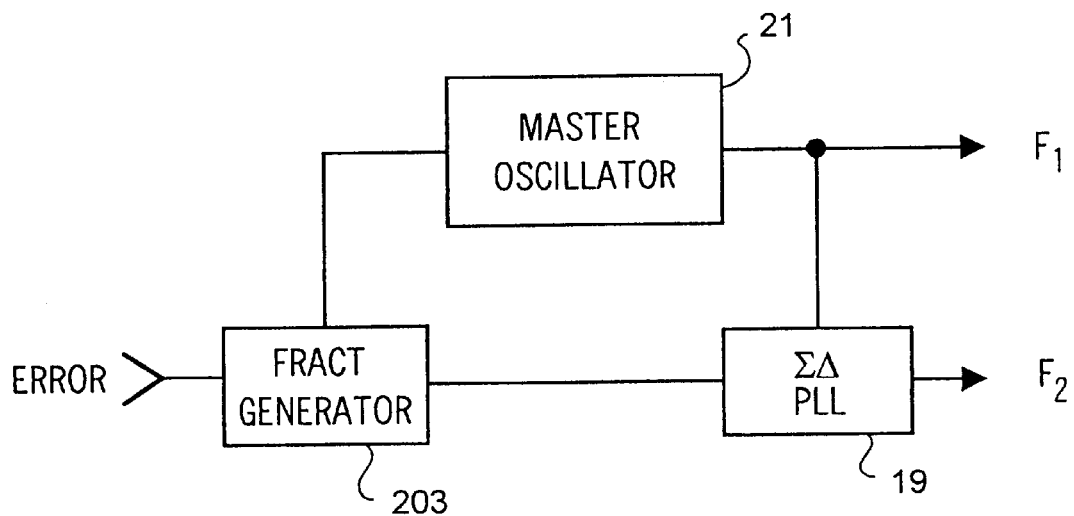

FIG. 13 is an embodiment of a CPU 300 which may be the core CPU within a device such as the digital signal processor 100 of FIG. 12. The Sigma Delta Phase Lock Loop 19 is used to generate the core clock for the CPU 300. The operating systems monitor the idle time in the system and based upon the measure of the idle time, it is used to adjust the clock speed through the power conservation mode 204, so as to minimize the idle time resulting in maximum CPU efficiency, minimum power consumption. This is am important ability in power sensitive devices, such as laptop computers. Additionally, a low power detect circuit 205 can detect when a battery is low and provide an input to the power conversion mode 204 which causes the FRACT generator to reduce the clock speed provided by the Sigma Delta Phase Lock Loop 19. Using the features of the Sigma Delta Phase Lock Loop (PLL), there will be no loss of clock as the CPU 300 core clock is being changed with very fine gain control and variation in the frequency as possible, such as, 1 kilohertz size variations. This application of being able to adjust the core clock by solving Equation 1 within the FRACT generator 203 can be used to reduce power consumption by running the CPU 300 at a lower frequency resulting in lower power consumption. In FIG. 14, there is shown yet another embodiment of the invention in which there are applications requiring one or more precise frequencies. In this situation, the frequencies that were used often required dual oscillators. In this embodiment, a master oscillator 21 provides a first frequency F1. A FRACT generator 203 solves Equation 1 for a second frequency $F_2$ and through the application of the output of the FRACT generator to the Sigma Delta Phase Lock Loop (PLL) 19, $F_2$ can be obtained. In this example, the embodiment of FIG. 12 can be enhanced by using $F_1$ to provide the signal to the local oscillator for the transmit mixer and the receive local oscillator mixer within the RF transceiver 113 and the output of the Sigma Delta Phase Lock Loop (PLL) 19 can be used to provide the local clock signals for the conversion signal processor 104, the digital signal processor 100 and a microprocessor 102. In this embodiment, the detected error can also be applied to the FRACT generator to adjust $F_2$ so as the received data that is provided to the speaker 105 is not distorted due to discrepancies in the frequency of the transmitting station.

We claim:

1. A phase lock loop circuit for generating a clock signal, comprising:

a frequency generator that generates a reference signal having a plurality of pulses with a pulse occurring at a first frequency with a first period being defined as the time between a start of a first pulse and a start of a next following pulse;

a phase detector that detects phase differences between the reference signal and a feedback signal;

a voltage control oscillator operatively connected to the phase detector and in response to an output from the phase detector provides the clock signal, a programmable divider operatively connected to receive the clock signal, the programmable divider divides the clock signal by N+m to provide the feedback signal where N is an integer and m is a variable having a range of selectable values and where the division occurs within the first period of time; and error detection means for detecting speed errors in the clock signal and to select values for m based upon the detected errors, wherein the error detection means includes:

a memory connected to receive data at a first rate and to transfer the data in response to the clock signal;

overflow detect means for detecting an increase in the rate of loading data into the memory and to generate an overflow detect signal in response to the detected increase in rate of loading data into the memory;

a first accumulator having a first input, a second input and a first output with the first input being connected to receive the overflow detect signal and the second input being connected to receive the first output and wherein the accumulator accumulates the combination of the overflow detect signal with the first output and provides an accumulated signal; and a decoder operatively connected to receive the accumulated signal and to decode each value of m from the accumulated signal.

2. The phase lock loop according claim 1 wherein the error detection means further comprises:

a second accumulator having a third input, a fourth input and a second output with the third input being connected to the first output and the fourth input being connected to receive the second output and wherein the second accumulator accumulates the combination of the first output with the second output and provides a second accumulated signal; and the decoder further being operatively connected to receive both the accumulated and second accumulated signals and to decode each value of m from the accumulated and second accumulated signals.

3. The phase lock loop according claim 2 wherein the error detection means further comprises:

a first delay latch connected to receive the accumulated signal and to provide a delayed accumulated signal;

second delay latch connected to receive the second accumulated signal and to provide a delayed second accumulated signal, and the decoder being connected to decode m from the second accumulated signal, the delayed second accumulated signal, and the delayed accumulated signal.

4. The phase lock loop according to claim 3 wherein the error detection means includes a means that insures that the value of m of a first division is related to the value of m for the next following division such that jitter is minimized.

5. A phase lock loop circuit for generating a clock signal, comprising:

a frequency generator that generates a reference signal having a plurality of pulses with a pulse occurring at a first frequency with a first period being defined as the time between a start of a first pulse and a start of a next following pulse;

a phase detector that detects phase differences between the reference signal and a feedback signal;

a voltage control oscillator operatively connected to the phase detector and in response to an output from the phase detector provides the clock signal, a programmable divider operatively connected to receive the clock signal, the programmable divider divides the clock signal by N+m to provide the feedback signal where N is an integer and m is a variable having a range of selectable values and where the division occurs within the first period of time; and error detection means for detecting speed errors in the clock signal and to select values for m based upon the detected errors, wherein the error detection means includes:

a memory connected to receive data at a first rate and to transfer the data in response to the clock signal;

underflow detect means for detecting a decrease in the rate of loading data into the memory and to generate an underflow detect signal in response to the detected decrease in rate of loading data into the memory;

a first accumulator having a first input, a second input and a first output with the first input being connected to receive the underflow detect signal and the second input being connected to receive the first output and wherein the accumulator accumulates the combination of the underflow detect signal with the first output and provides an accumulated signal; and a decoder operatively connected to receive the accumulated signal and to decode each value of m from the accumulated signal.

6. The phase lock loop according to claim 5 wherein the error detection means further comprises:

a second accumulator having a third input, a fourth input and a second output with the third input being connected to the first output and the fourth input being connected to receive the second output and wherein the second accumulator accumulates the combination of the first output with the second output and provides a second accumulated signal; and the decoder further being operatively connected to receive both the accumulated and second accumulated signals and to decode each value of m from the accumulated and second accumulated signals.

7. The phase lock loop according claim 6 wherein the error detection means further comprises:

a first delay latch connected to receive the accumulated signal and to provide a delayed accumulated signal;

second delay latch connected to receive the second accumulated signal and to provide a delayed second accumulated signal; and the decoder being connected to decode m from the second accumulated signal, the delayed second accumulated signal, and the delayed accumulated signal.

8. The phase lock loop according to claim 7 wherein the error detection means includes a circuit that insures that the value of m of a first division is related to the value of m for the next following division such that jitter is minimized.

9. A phase lock loop circuit for generating a clock signal, comprising:

a frequency generator that generates a reference signal having a plurality of pulses with a pulse occurring at a first frequency with a first period being defined as the time between a start of a first pulse and a start of a next following pulse;

a phase detector that detects phase differences between the reference signal and a feedback signal;

a voltage control oscillator operatively connected to the phase detector and in response to an output from the phase detector provides the clock signal, a programmable divider operatively connected to receive the clock signal, the programmable divider divides the clock signal by N+m to provide the feedback signal where N is an integer and m is a variable having a range of selectable values and where the division occurs within the first period of time; and error detection means for detecting speed errors in the clock signal and to select values for m based upon the detected errors, wherein the error detection means comprises:

a memory connected to receive data at a first rate and to transfer the data in response to the clock signal; and error detect means for detecting an error in the rate of loading data into the memory and to generate an error detect signal in response to the detected error in rate of loading data into the memory.

10. The phase lock loop according 9 wherein the error detection means includes:

a first accumulator having a first input, a second input and a first output with the first input being connected to receive the error detect signal and the second input being connected to receive the first output and wherein the accumulator accumulates the combination of the error detect signal with the first output and provides an accumulated signal; and a decoder operatively connected to receive the accumulated signal and to decode each value of m from the accumulated signal.

11. The phase lock loop according claim 10 wherein the error detection means further comprises:

a second accumulator having a third input, a fourth input and a second output with the third input being connected to the first output and the fourth input being connected to receive the second output and wherein the second accumulator accumulates the combination of the first output with the second output and provides a second accumulated signal; and the decoder further being operatively connected to receive both the accumulated and second accumulated signals and to decode each value of m from the accumulated and second accumulated signals.

12. The phase lock loop according claim 11 wherein the error detection means further comprises:

a first delay latch connected to receive the accumulated signal and to provide a delayed accumulated signal;

second delay latch connected to receive the second accumulated signal and to provide a delayed second accumulated signal; and the decoder being connected to decode m from the second accumulated signal, the delayed second accumulated signal, and the delayed accumulated signal.

13. The phase lock loop according to claim 12 wherein the error detection means includes a circuit that insures that the value of m of a first division is related to the value of m for the next following division such that jitter is minimized.

14. A method for generating a clock signal with a phase lock, comprising the steps of:

generating a reference signal having a plurality of pulses with a pulse occurring at a first frequency with a first period being defined as the time between a start of a first pulse and a start of a next following pulse;

detecting the phase differences between the reference signal and a feedback signal;

adjusting the output frequency of a voltage control oscillator with the phase differences between the reference signal and a feedback signal to obtain the clock signal;

dividing the clock signal by N+m to Provide the feedback signal and where N is an integer and m is a variable having a range of selectable values and where the division occurs within the first period of time;

detecting speed errors in the clock signal, wherein the step of detecting speed errors comprises:
loading data into a memory at a first rate;
transferring the data from the memory in response to the clock signal;
detecting a difference in the rate of loading data into the memory; and
generating a difference detect signal in response to the detected difference in the rate of loading data into the memory and the clock signal; and selecting values for m based upon the detected speed errors, wherein the step of selecting values for m includes the steps of:
combining the difference detect signal with a first output of a first accumulator;
accumulating the combination of the difference detect signal in the first accumulator, the first accumulator having a first input, a second input and a first output with the first input being connected to receive the difference detect signal and the second input being connected to receive the first output and to provide as an output an accumulated signal; and
decoding each value of m from the accumulated signal.

15. The method according claim 14 wherein the step of selecting values for m further comprises:

combining the accumulated signal with the output of a second accumulator;

accumulating the combination of the accumulated signal and the out put of the second accumulator in the second accumulator to obtain a second accumulated signal; and the step of decoding each value of m further includes the step of decoding each value of m from the accumulated and second accumulated signals.

16. The method according claim 15 wherein the step of decoding each value of m comprises:

storing the accumulated signal in a latch to provide a delayed accumulated signal;

storing the second accumulated signal in a second latch to provide a delayed second accumulated signal; and decoding each value of m from the second accumulated signal, the delayed second accumulated signal, and the delayed accumulated signal.

17. The method according to claim 16 further comprising the steps of:

preventing jitter in the clock signal with a circuit means that insures that the value of m of a first division is related to the value of m for the next following division such that jitter is minimized.

18. A means for generating a clock signal, comprising:

means for loading data into a memory at a first rate;

clock signal means for transferring the data from the memory with a clock signal;

means for detecting a difference in the rate of loading data into the memory and the clock signal; and generator means for generating a difference detect signal in response to the detected difference in the rate of loading data into the memory and the clock signal, wherein the generator means comprises:
means for combining the difference detect signal with a first output of a first accumulator;
means for accumulating the combination of the difference detect signal and the first accumulated signal and to provide as an output the first accumulated signal; and
decoder means for decoding each value of m from the first accumulated signal.

19. The means according to claim 18 wherein the means for selecting values for m further comprises:

means for combining the accumulated signal with the output of a second accumulator;

means for accumulating the combination of the accumulated signal and the out put of the second accumulator in the second accumulator to obtain a second accumulated signal; and the decoder means further includes means for decoding each value of m from the accumulated and second accumulated signals.

20. The means according claim 19 wherein the decoder means for decoding each value of m comprises:

first latch means for storing the accumulated signal to provide a delayed accumulated signal;

second latch means for storing the second accumulated signal to provide a delayed second accumulated signal; and the decoder means further includes means for decoding each value of m from the second accumulated signal, the delayed second accumulated signal, and the delayed accumulated signal.

21. The means according to claim 20 further comprising:

means for preventing jitter in the clock signal with a circuit means that insures that the value of m of a first division is related to the value of m for the next following division such that jitter is minimized.

* * * * *